(12) United States Patent
Poon et al.

(10) Patent No.: US 7,714,762 B2
(45) Date of Patent: May 11, 2010

(54) METHOD AND APPARATUS FOR CURRENT-MODE ADC

(75) Inventors: Chi-Sang Poon, Lexington, MA (US); Guy Rachmuth, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1343 days.

(21) Appl. No.: 11/104,270

(22) Filed: Apr. 12, 2005

(65) Prior Publication Data

US 2006/0228046 A1 Oct. 12, 2006

(51) Int. Cl.
*H03M 1/38* (2006.01)
(52) U.S. Cl. .................................. 341/161; 341/155
(58) Field of Classification Search ................ 341/161, 341/155, 144, 122, 135
See application file for complete search history.

(56) References Cited

U.S. PATENT DOCUMENTS

| | | | |
|---|---|---|---|
| 4,641,130 A * | 2/1987 | Mastroianni | 341/136 |
| 4,958,123 A * | 9/1990 | Hughes | 323/316 |
| 5,598,161 A * | 1/1997 | Yamada | 341/159 |
| 5,675,341 A | 10/1997 | Vallancourt et al. | |
| 5,677,692 A | 10/1997 | Hasegawa | |
| 5,963,158 A | 10/1999 | Yasuda | |
| 5,990,820 A * | 11/1999 | Tan | 341/161 |
| 6,288,663 B1 * | 9/2001 | Hester et al. | 341/155 |
| 6,326,914 B1 | 12/2001 | Sevenhans | |
| 6,933,876 B1 * | 8/2005 | Underbrink et al. | 341/162 |
| 7,102,365 B1 * | 9/2006 | Atris et al. | 324/658 |
| 2004/0130473 A1 | 7/2004 | Snoeijs | |

FOREIGN PATENT DOCUMENTS

WO WO 2004.010586 A2 1/2004

OTHER PUBLICATIONS

David G. Nairn, C. Andre T. Salama, Current-Mode Algorithmic Analog-to-Digital Converters, Aug. 1990, pp. 997-1004, vol. 25, No. 4, Toronto, Ontario, Canada.
L. Ravezzi, D. Stoppa, G.-G. Dalla Betta, Current-mode A/D Converter, Apr. 2, 1998, pp. 615-616, vol. 34, No. 7, Electronics Letter.
PCT/US2006/008635 International Search Report dated Jul. 26, 2005.
V. Tipsuwanporn, A Numsomran, W. Chuchotsakunleot, S. Chuenarom and S. Maitreechit, Algorithmic ADS Using Current Mode Without DAC, 2002, pp. 453-456, Faculty of Engineering, King Mongkul's Institute of Technology, Ladkrabang, Bangkok, Thailand.
David G. Narin, C. Andre T. Salama, Current-Mode Algorithmic Analog-to-Digital Converters, Aug. 25, 1990, pp. 1-8, No. 4, New York.

(Continued)

*Primary Examiner*—Peguy JeanPierre
(74) *Attorney, Agent, or Firm*—Daly, Crowley, Mofford & Durkee, LLP

(57) ABSTRACT

A current-mode analog-to-digital (IADC) has subnA sensitivity. An IADC cell receives an input current signal and provides an output to a comparator for comparison with an adjustable input reference signal. A digital output signal is generated and an analog output is provided to the next cell.

21 Claims, 5 Drawing Sheets

OTHER PUBLICATIONS

A.J. Correia, J.C. Guilherme, J.E. Franca, Current-Mode Algorithmic Pipeline Analog-to-Digital Converter, Nov. 18-21, 1996, pp. 401-404, Proceedings of IEEE Asia Pacific Conference on Circuits and Systems '96, Seoul, Korea.

A. Agarwal, Y.B. Kim, S. Sonkusale, Low Power Current Mode ADC for CMOS Sensor IC, 2005, pp. 584-587, Department of Electrical Engineering, Texas A&M University, College Station, Texas and Department of Electrical and Computer Engineering, Tufts University, Medford, Massachusetts.

Philippe O. Pouliquen, Kwabena A. Boahen, Andrea G. Andreou, A Gray-Code MOS Current-Mode Analog-to-Digital Converter Design, 2000, pp. 1924-1927, Department of Electrical Engineering and Computer Engineering, The John Hopkins University, Baltimore, Maryland.

* cited by examiner

METHOD AND APPARATUS FOR CURRENT-MODE ADC

STATEMENT REGARDING FEDERALLY SPONSORED RESEARCH

This invention was made with government support under Grant No. F49620-02-C-0041, awarded by the United States Air Force Office of Scientific Research and under Grant No. 5-R01-HL072849-04, awarded by the National Institutes of Health. The government has certain rights in this invention.

CROSS REFERENCE TO RELATED APPLICATIONS

Not applicable.

BACKGROUND

As is known in the art, analog-to-digital converters (ADCs) convert a signal in analog format to a signal in digital format. Conventional ADC circuits can have a variety of circuit architectures each of which has certain concomitant disadvantages. Known ADC architectures include pipeline, sigma-delta, cyclic, flash, successive approximation, and dual-slope. Each ADC architecture is generally applicable to a limited operating range. That is, each of these architectures has strengths and weaknesses that make them more amenable to working in certain frequency and resolution ranges.

Some ADC architectures do not operate outside certain ranges or consume prohibitively high power in certain ranges as compared to other architectures. Even within preferred operating ranges, a given architecture can have a performance level that is dictated by certain circuit parameters that are fixed for a given design.

High-performance analog-to-digital converters (ADCs) are generally optimized for conversion speed and resolution with a given size and power budget. In CMOS-based mobile biochemical sensor application, however, speed and resolution are immaterial because of the slow reaction rates (>seconds) and inherent experimental errors (~10%) typical of most biochemical reactions. Instead, ADC sensitivity, power consumption and size may be of greater interest.

In one known attempt to apply ADCs to biochemical reactions, to convert sub-nA level photo currents into voltage, the input signal is amplified using large-gain ($10^6$) current mirrors, increasing power and area requirements and the current mirror's susceptibility to mismatch errors for a given chip area, as disclosed in U. Lu, Hu, B. C-P., Shih, Y-C., Wu, C-Y, and Yang, Y-S, "The design of a novel complementary metal oxide semiconductor detection system for biochemical luminescence," *Biosensors and Bioelectronics*, vol. 19, pp. 1185-1191, 2004, which is incorporated herein by reference.

In M. Simpson, Sayler, G, Patterson, G, Nivens, E, Bolton, E., Rochells, J., Arnott, J, Applegate, B., Ripp, S., and Guillom, M., "An integrated CMOS microluminometer for low-level luminescence sensing in the bioluminescent bioreporter integrated circuit," *Sensors and Actuators B*, vol. 72, pp. 134-140, 2002, which is incorporated herein by reference, increased ADC sensitivity was achieved by successive capacitive integration and voltage-to-frequency conversion at the expense of increased power consumption and long conversion time (~ seconds).

BRIEF DESCRIPTION OF THE DRAWINGS

The exemplary embodiments contained herein will be more fully understood from the following detailed description taken in conjunction with the accompanying drawings, in which.

DETAILED DESCRIPTION

In general, the inventive current-mode analog-to-digital converter has a structure that provides sub-nA sensitivity. Due to low-voltage low-power and small-size capabilities, the inventive ADC (Analog-to-Digital Converter) is well-suited for portable chemical or biosensor applications, for example. As will be readily understood by one skilled in the art, CMOS (Complementary Metal-Oxide Semiconductor)-based integrated biochemical sensors generate photo currents at sub-nanoampere (nA) levels, which present a challenge for digital data acquisition.

The inventive current-mode ADC (IADC) is capable of digitizing photo currents, for example, at a speed and resolution commensurate with such applications. In one embodiment, the IADC operates at a supply voltage ($V_{DD}$) as low as about 1.2V, contains no capacitors or clocks, and can be directly integrated alongside the CMOS photodiode in well known fabrication processes.

Figure 1:
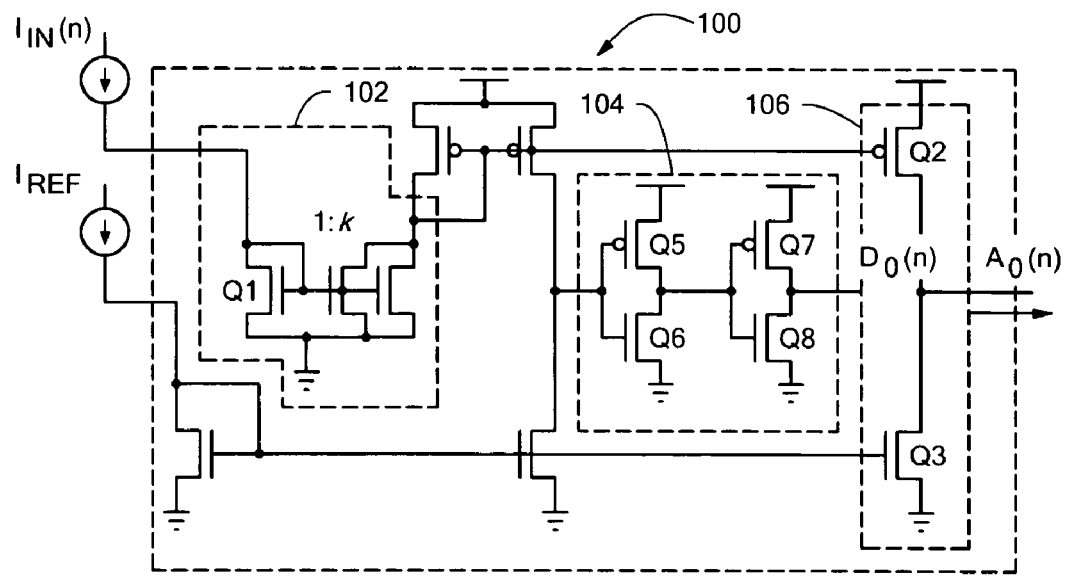
FIG. 1 is a circuit diagram of an exemplary ADC unit cell in accordance with the present invention.

FIG. 1 shows an exemplary IADC cell 100 in accordance with the present invention. Cells n=1, 2, . . . N are cascaded with the analog output of one cell connected to the analog input of the following cell, as shown and described in FIG. 2. The analog input $I_{IN}(n)$ into cell n is scaled using a 1:$k_n$ scaling circuit 102. In an exemplary embodiment, the scaling circuit 102 includes a current mirror having transistor Q1. A comparator 104 includes switches Q5-Q8 coupled as shown providing a digital output signal $D_O(n)$. The output signal $D_O(n)$ is a logical HI if $k_n \cdot I_{IN}(n)$ is greater than a user-defined reference current $I_{REF}$. Otherwise the cell output signal $D_O(n)$ is a logical LO.

To ensure operation in the sub-nanoAmpere range, transmission switches gated by $D_O(n)$ included in some prior art configurations, are eliminated in order to avoid large switching current artifacts that may disrupt the signal conversion process. D. G. Naim, and Salama, A., "Current-mode algorithmic analog to digital converter," IEEE Journal of Solid State Circuits, vol. 25, pp. 997-1004, 1991, which is incorporated herein by reference, is an example of a prior art ADC having a transmission switch gated by a digital output signal.

Due to the switch elimination in the inventive ADC cell, the input current ($I_{IN}(n+1)=k_n \cdot I_{IN}(n)-I_{REF}$) into the next cell via a subtraction circuit 106, which includes current subtraction transistors Q2, Q3, is no longer dependent on the comparator 104 output signal $D_O(n)$. That is, the analog current signal $A_O(n)$ passed to the next cell (n+1) is independent from the digital output. This flash-type architecture increases the conversion speed for given operating conditions As is known in the art, traditional flash architecture generates a thermometer code according to a voltage divider sequence. In contrast, in the inventive IADC the $1:k_n$ scaling of input current $I_{IN}$ in each cell 100 provides an equivalent current divider sequence $[1-(k_1 \cdot k_2 \ldots k_n)^{-1}]$, n=1, 2 ... N, for the range $I_{REF}/k_1 \leq I_{IN}(1) \leq I_{REF}$, where $I_{IN}(1)$ is the current input to the IADC, and $k_1$ is the mirror ratio of n=1. When $k_n \cdot I_{IN}(n) < I_{REF}$ for cell n, the inputs to all subsequent cells are zero so that $D_O(n:N)$ is a logical LO. Thus the analog input is quantized by the largest value of n such that $D_O(n)$ is a logical HI.

Where conventional IADC designs allow high-speed conversion down to the μA range by biasing the transistors in the strong-inversion (above-threshold) regime, sub-nA sensitivity is achieved in exemplary embodiments of the inventive ADC. In addition, a relatively low supply voltage $V_{DD}$, e.g., about 1.2V can be used.

Figure 2:
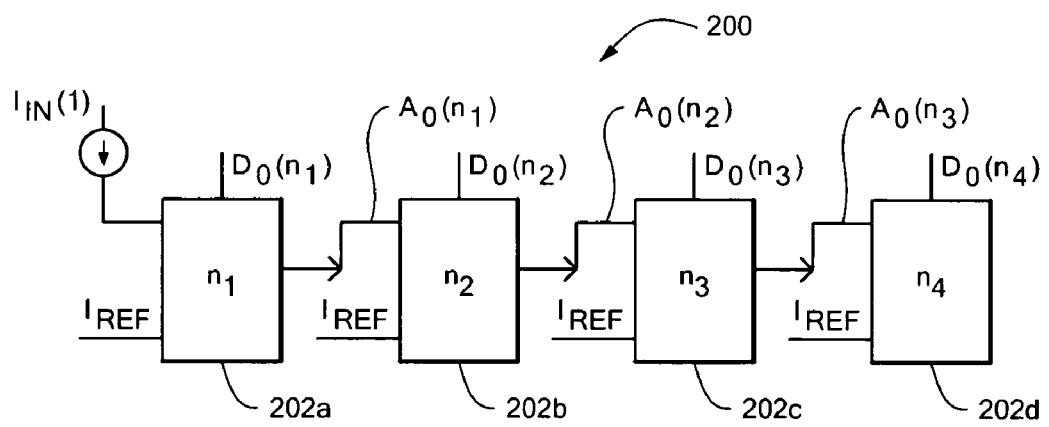
FIG. 2 is a block diagram of an ADC having cells coupled together.

FIG. 2 shows an exemplary IADC 200 having a series of cascaded cells 202*a-d*, which can be provided as the cell 100 of FIG. 1. An input current signal $I_{IN}(1)$ along with a reference current $I_{REF}$ is provided to the first cell 202*a*, which produces a first digital output signal $D_O(n1)$. An analog output signal $A_O(n1)$, i.e., (($I_{IN}(2)=k_1 \cdot I_{IN}(1)-I_{REF}$), is provided by the first cell 202*a* to the analog input of the second cell 202*b*, which generates a second digital output signal $D_O(n2)$, and so on.

As noted above, when $k_n \cdot I_{IN}(n) < I_{REF}$ for cell n, the inputs to all subsequent cells are zero so that $D_O(n:N)$ is a logical LO. The cell digital output signal $D_O(n)$ is a logical HI if $k_n \cdot I_{IN}(n)$ is greater than the user-defined reference current $I_{REF}$.

In some conventional designs, such as D. G. Naim et al. cited above, a drawback of the cell design is that in the region $k_n \cdot I_{IN}(n) \approx I_{REF}$ where the currents in the subtraction transistors Q2, Q3 of cell n are almost balanced, the drain current of transistor Q1 in the next cell n+1 may cause a significant error.

As shown in the exemplary inventive embodiment 200 of FIG. 3, where like reference numbers in FIG. 1 indicate like elements, this drawback is overcome by redefining the input-output relationship of each cell as follows: A set of cells m=1, 2, . . . M are cascaded but with $I_{IN}(m+1)=k_m I_{IN}(m)$ via transistor Q4 coupled to the current mirror 102. This results in a current divider sequence $(k_1 \cdot k_2 \ldots k_m)^{-1}$ for the range $0 \leq I_{IN}(1) \leq I_{REF}/k_M$, such that when $I_{IN}(m) > I_{REF}/k_m$, $D_O(m:M)$ is HI. In this case, the analog input $I_{IN}(m)$ is quantized by the smallest m such that $D_O(m)$ is LO.

Figure 4:
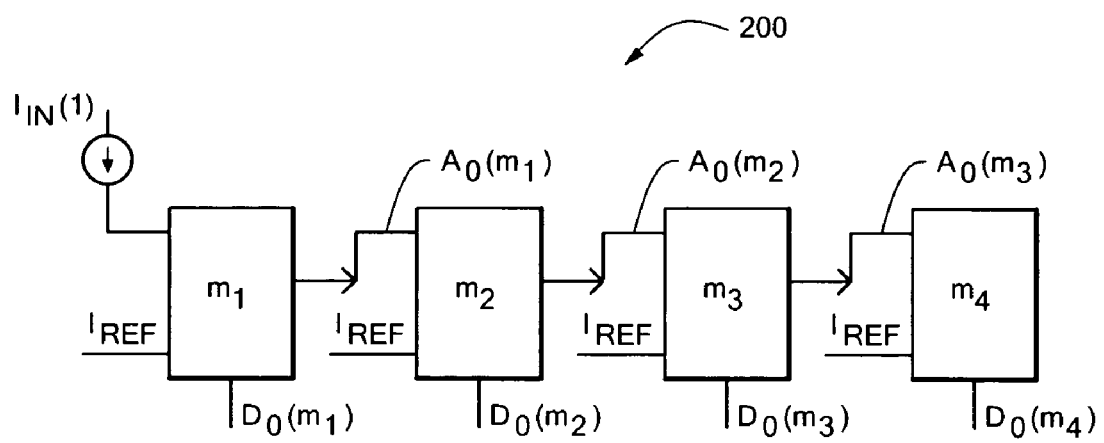
FIG. 4 is a block diagram of a further ADC having cells coupled together.

FIG. 4 shows an exemplary IADC 300 having a series of cascaded m-type cells 302 each providing a digital output signal $D_O(m)$ and an output analog signal $A_O(m)$, which can be provided as the $I_{IN}$ to next cell.

Both the n-cell (FIGS. 1 and 2) and m-cell (FIGS. 3 and 4) type IADCs have a variable dynamic range that is set by $I_{REF}$. $I_{REF}$ values in or below the nA range bias the transistors in the subthreshold regime, allowing the conversion of sub-nA currents.

Figure 5:
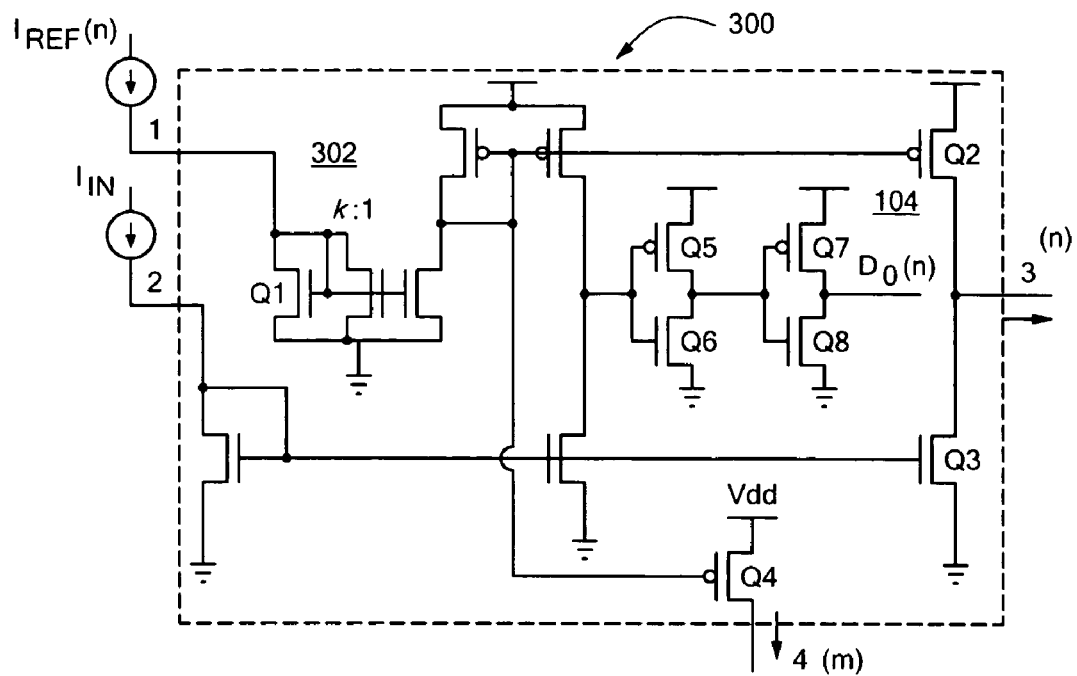
FIG. 5 is a circuit diagram of an ADC unit cell having scaling of a reference signal.
Figure 5A:
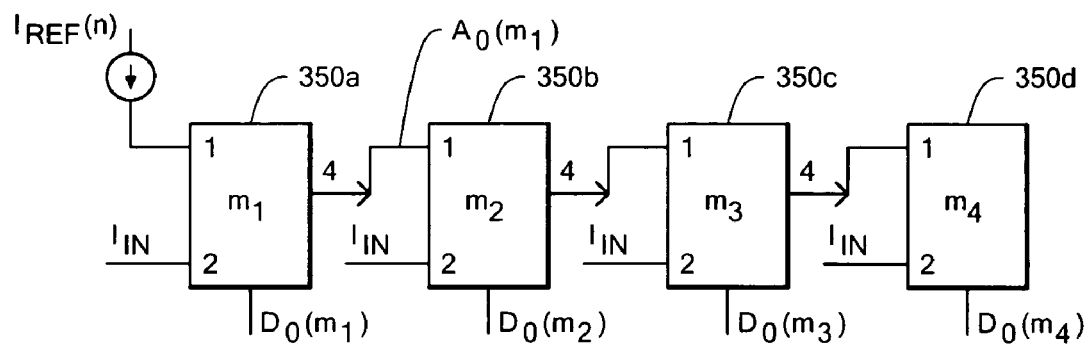
FIG. 5A is a block diagram of another ADC having cells coupled together.

It is understood that the input signal and/or the reference signal can be scaled to meet the needs of a particular application. FIG. 5 shows an exemplary implementation 300 in which the reference signal $I_{REF}(n)$ is scaled by a scaling circuit 302, such as a current mirror. It is understood that the illustrated cell 300 includes n-type and m-type circuitry. In this arrangement, m and n type cells receive a copy of $I_{IN}(1)$, which is referred to as $I_{IN}$ and is the same for all cells in the exemplary embodiment shown. The cell digital output signal $D_O(n)$ is a logical HI if $k_n \cdot I_{REF}(n)$ is greater than $I_{IN}$. When $k_n \cdot I_{REF}(n) < I_{IN}$ for cell n, the inputs to subsequent cells are zero so that $D_O(n:N)$ is a logical LO. Thus the analog input is quantized by the largest value of n such that $D_O(n)$ is a logical HI. In the m-cell case, the analog input $I_{IN}$ is quantized by the smallest m such that $D_O(m)$ is LO. As shown in FIG. 5A, an analog output signal $A_O(m1)$, i.e., (($I_{REF}(2)=k1 \cdot I_{REF}(1)-I_{IN}(1)$), is provided by the first cell 350*a* to the analog input of the second cell 350*b*, which generates a second digital output signal $D_O(m2)$, and so on.

EXAMPLE

Figure 3:
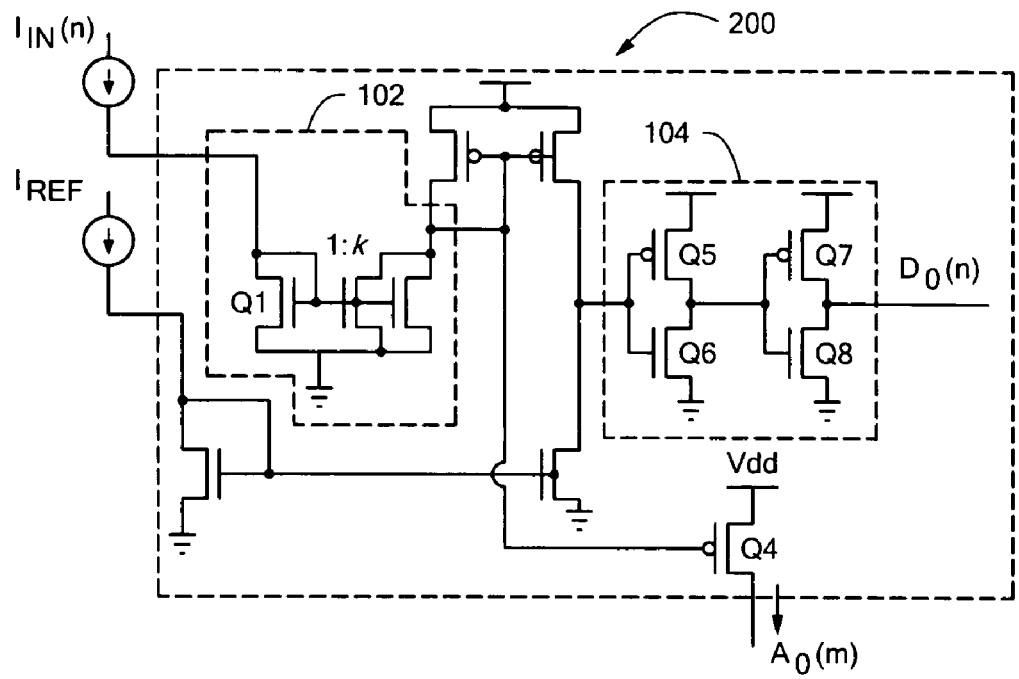
FIG. 3 is a circuit diagram of a further exemplary ADC unit cell in accordance with the present invention.

The IADC designs shown in FIGS. 1 and 3 were simulated on T-Spice and a prototype chip was fabricated using an AMI 1.5 μm process. For convenience the results for 4 m-cells and 4 n-cells with $k_n=k_m=2$ are presented. It is understood, however, that the illustrated designs can be readily extended to any number of cells with arbitrary current divider ratios.

In general, the simulations showed that the m-cells of FIG. 3 generally had higher sensitivity and accuracy than the n-cells of FIG. 1. Measurements of the fabricated IDAC with a Keithley 6485 picoammeter showed that the m-cells had an input current sensitivity of <100 picoampere (pA).

The IADC response bandwidth is determined by the conversion delay, which is given by the maximum rise or fall time (whichever is longer) of cell responses when switching on or off, respectively. For each cell, this value is determined primarily by the corresponding comparator's switching time, τ $\propto (C_L \cdot V_{DD})/(I_{IN}-I_{REF})$, where $C_L$ is the load capacitance.

Figure 6:
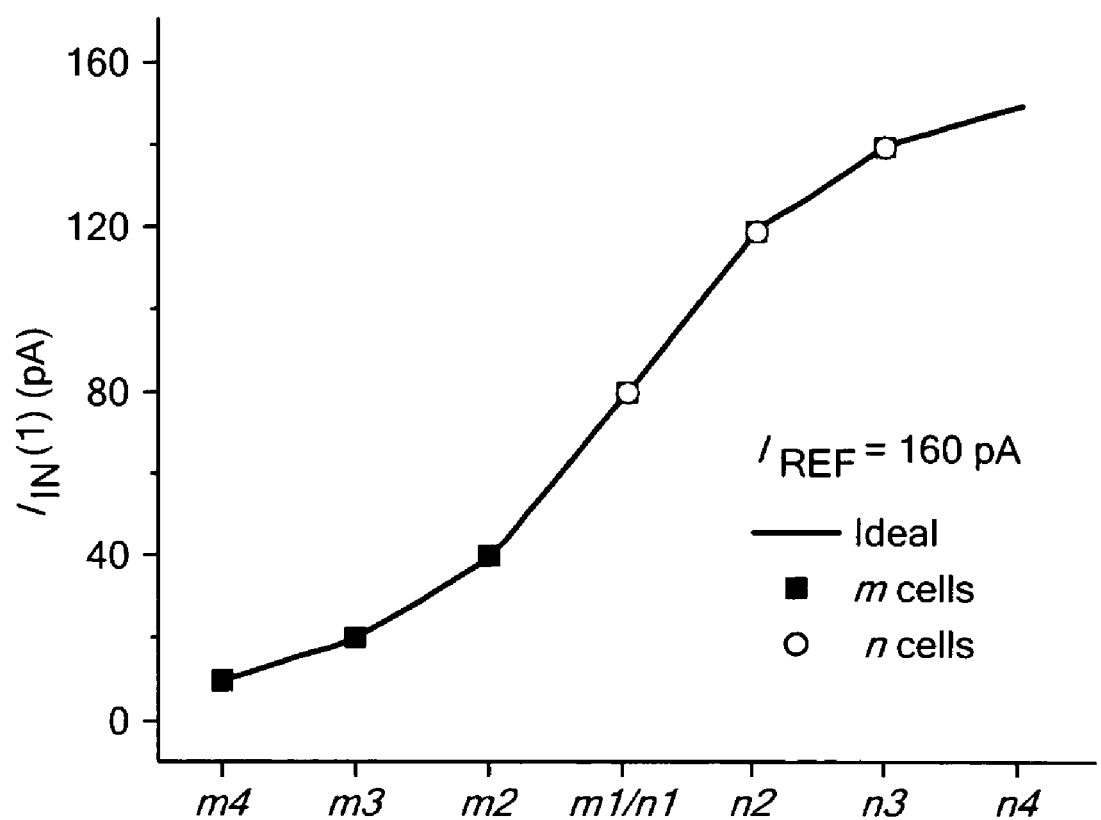
FIG. 6 is a graphical depiction of simulation results for a 4-cell ADC in accordance with the present invention.

Looking to FIG. 6, the simulations showed that for $V_{DD}=1.2V$ and a square-wave current input with amplitude $\hat{I}_{IN}(1)=0.1$ nA and $I_{REF}=1.6$ nA, the conversion delay was <500 μs. At $\hat{I}_{IN}(1)=1$ nA and $I_{REF}=16$ nA, the conversion delay was <15 μs.

Figure 7A:
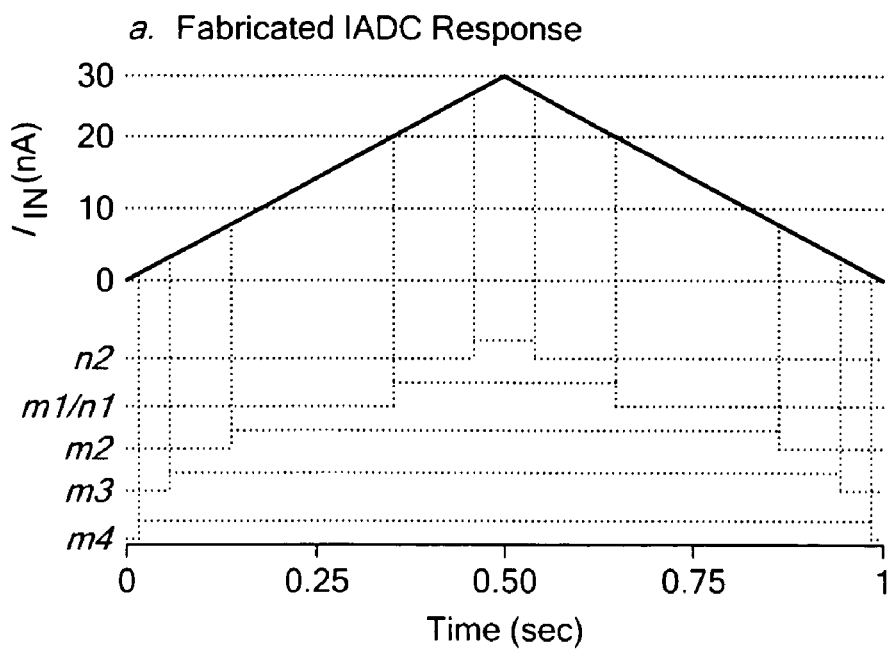
FIGS. 7A and 7B are graphical depictions of simulated and fabricated responses respectively, for an ADC in accordance with the present invention.
Figure 7B:
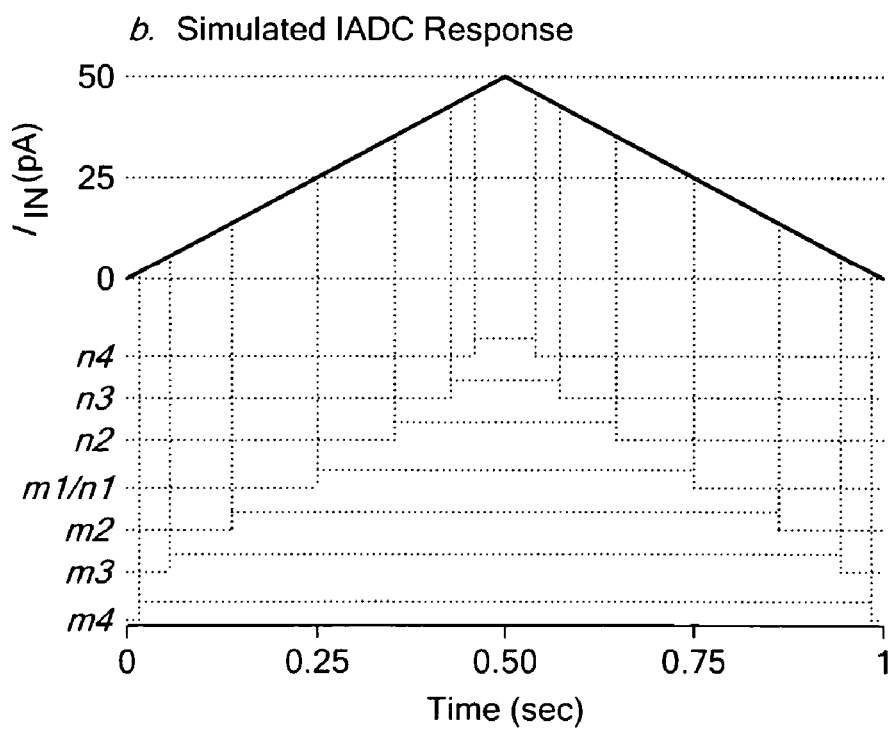

In FIG. 7A, the fabricated IADC chip responded to a triangular-wave input with peak current $\hat{I}_{IN}(1)=30$ nA at a frequency of 1 Hz. Similar results were obtained for $\hat{I}_{IN}(1)$ down to 1 nA. At even lower input currents or higher frequencies, measurements were limited by the response of the testbed, which was not designed to operate at such low current levels. Simulations showed that the IADC converted the signal with $\hat{I}_{IN}(1)=50$ pA at a frequency of 1 Hz (FIG. 6B). In practice, the IADC can interface directly to the CMOS photodiode on chip, preserving the IADC response as predicted by simulations.

Because of inevitable current-mirror mismatch, the resulting current divider ratios may differ from the designed value of two. In FIG. 7A, a simple calibration procedure yielded the actual ratios of 2.44, 2.36, and 2.6 for m4/m3, m3/m2, and m2/m1, respectively. Once calibrated, proper IADC operation was achieved. In practice, mismatch errors may be further minimized by increasing transistor sizes or decreasing process dimensions for a given size.

The present invention provides an IADC having high input sensitivity, low supply voltage $V_{DD}$ and a programmable dynamic range. The illustrated embodiments can have a design that is simple, small, and power efficient. A conversion cell with $I_{REF}=1$ nA uses <10 nW of static power.

The resultant IADC conversion speed is generally adequate for biosensor applications. For example, the sub-nA level currents from an HRP-luminal-$H_2O_2$ system in can be digitized in <1 second, allowing ample temporal resolution for the measurement of initial reaction rates that are important to enzyme kinetics.

The inventive IADC can be readily integrated with portable CMOS sensors at reduced overall power, size, and cost. Its input sensitivity, speed and resolution can be further enhanced by employing sub-pA circuits and low-voltage wide-input comparator design techniques and with increased number of conversion cells.

Having described preferred embodiments of the invention, it will now become apparent to one of ordinary skill in the art that other embodiments incorporating their concepts may also be used. These embodiments should not be limited to disclosed embodiments but rather should be limited only by the spirit and scope of the appended claims. All publications and references cited herein are expressly incorporated herein by reference in their entirety.

Other embodiments are within the scope of the following claims.

What is claimed is:

1. A current mode ADC device, comprising:
a first cell including:
   a first input terminal to receive an analog input signal;
   a second input terminal to receive a reference signal;
   a scaling circuit to scale a first one of the input signal and the reference signal;
   a comparator to compare the analog input signal and the reference signal and generate a digital output signal; and
   an output terminal to transmit an analog output signal to a second cell, wherein the analog output signal is independent from the digital output signal,
wherein the second cell includes:
   a second cell first input terminal to receive the analog input signal transmitted from the first cell;
   a second cell second input terminal to receive a second cell reference signal;
   a second cell scaling circuit to scale a first one of the second cell input signal and the second cell reference signal;
   a second cell comparator to compare the analog input signal transmitted from the first cell and the second cell reference signal and generate a second cell digital output signal; and
   a second cell output terminal to transmit a second cell analog output signal, wherein the second cell analog output signal is independent from the second cell digital output signal.

2. The device according to claim 1, wherein the scaling circuit scales the input signal.

3. The device according to claim 1, wherein the scaling circuit scales the reference signal.

4. The device according to claim 1, wherein the scaling circuit scales the input signal and the reference signal.

5. The device according to claim 1, wherein the scaling circuit includes a current mirror.

6. The device according to claim 1, wherein the ADC device has subnA sensitivity.

7. The device according to claim 1, wherein a variable dynamic range of the ADC corresponds to the reference signal.

8. The device according to claim 1, wherein the device can run on a supply voltage of less than about 1.2 Volts and does not contain a capacitor.

9. A method of digitizing an analog signal, comprising:
for a first cell in an analog-to-digital converter:
   receiving an analog input signal ($I_{IN}(1)$ for the first cell (1);
   receiving a reference signal ($I_{REF}$);
   scaling the analog input signal by a scaling factor $k_1$ to generate a scaled analog input signal ($k_1 I_{IN}(1)$);
   providing the scaled analog input signal ($k_1 I_{IN}(1)$) and the reference signal ($I_{REF}$) to a comparator to generate a digital output signal $D_O(1)$; and
   generating an analog output signal for transmission to a second cell cascaded to the first cell, wherein the analog output signal is independent of the digital output signal,
wherein the second cell includes:
   a second cell first input terminal to receive the analog input signal transmitted from the first cell;
   a second cell second input terminal to receive a second cell reference signal;
   a second cell scaling circuit to scale a first one of the second cell input signal and the second cell reference signal;
   a second cell comparator to compare the analog input signal transmitted from the first cell and the second cell reference signal and generate a second cell digital output signal; and
   a second cell output terminal to transmit a second cell analog output signal, wherein the second cell analog output signal is independent from the second cell digital output signal.

10. The method according to claim 9, wherein the digital output signal is a logical HI if the scaled analog input signal ($k_1 I_{IN}(1)$) for the first cell is greater than the reference signal ($I_{REF}$).

11. The method according to claim 10, wherein the analog output signal from the first cell corresponds to $k_1 I_{IN}(1) - I_{REF}$.

12. The method according to claim 9, further including quantizing the analog input signal by a largest value of n such that the digital output signal $D_O(n)$ is a logical HI, where $k_n I_{IN}(n+1)$ is less than $I_{REF}$ for cell (n+1), wherein n is a cell index value.

13. The method according to claim 9, wherein the analog output signal corresponds to $k_1 I_{IN}(1)$.

14. The method according to claim 13, wherein the digital output signal $D_O(m:M)$ is a logical HI when $I_{IN}(m) > I_{REF}/k_m$ for a set of cells m=1, 2, . . . , M.

15. The method according to claim 14, further including quantizing the analog input signal by the smallest m such that the digital output signal $D_O(m)$ is a logical LO.

16. The method according to claim 9, wherein the analog input signal is less than 1 nA.

17. The method according to claim 9, further including scaling both of the input signal and the reference signal.

18. A method of digitizing an analog signal, comprising:
for a first cell in an analog-to-digital converter:
   receiving an analog input signal ($I_{IN}(1)$) for the first cell (1);
   receiving a reference signal ($I_{REF}$);
   scaling the reference signal by a scaling factor $k_1$ to generate a scaled reference signal ($k_1 I_{REF}$);
   providing the scaled reference signal ($k_1 I_{REF}$) and the input signal ($I_{IN}(1)$) to a comparator to generate a digital output signal $D_O(1)$; and
   generating an analog output signal for transmission to a second cell cascaded to the first cell, wherein the analog output signal is independent of the digital output signal, wherein the second cell includes:
- a second cell first input terminal to receive the analog input signal transmitted from the first cell;
- a second cell second input terminal to receive a second cell reference signal;
- a second cell scaling circuit to scale a first one of the second cell input signal and the second cell reference signal;
- a second cell comparator to compare the analog input signal transmitted from the first cell and the second cell reference signal and generate a second cell digital output signal; and
- a second cell output terminal to transmit a second cell analog output signal, wherein the second cell analog output signal is independent from the second cell digital output signal.

19. The method according to claim 18, wherein the analog output signal from the first cell corresponds to $k_1 I_{REF} - I_{IN}$.

20. The method according to claim 18, further including quantizing the analog input signal by a largest value of n such that the digital output signal $D_O(n)$ is a logical HI, where $k_n I_{REF}(n+1)$ is less than $I_{IN}$ where n is a cell index value.

21. The method according to claim 18, further including quantizing the analog input signal by the smallest in such that the digital output signal $D_O(m)$ is a logical LO, where m is a cell index value.

* * * * *

UNITED STATES PATENT AND TRADEMARK OFFICE
CERTIFICATE OF CORRECTION

| | | |
|---|---|---|
| PATENT NO. | : 7,714,762 B2 | Page 1 of 1 |
| APPLICATION NO. | : 11/104270 | |
| DATED | : May 11, 2010 | |
| INVENTOR(S) | : Poon et al. | |

It is certified that error appears in the above-identified patent and that said Letters Patent is hereby corrected as shown below:

Col. 3, line 59, delete "to next" and replace with --to the next--

Col. 4, line 13, delete "...k1..." and replace with --...$k_1$...--

Col. 5, line 1, delete "system in can" and replace with --system can--.

Col. 8, line 11, delete "smallest in" and replace with --smallest m--.

Signed and Sealed this
Eleventh Day of January, 2011

David J. Kappos
*Director of the United States Patent and Trademark Office*